United States Patent [19]

Wong et al.

[11] Patent Number: 5,714,036
[45] Date of Patent: Feb. 3, 1998

[54] CHLORINE REDUCTION MODULE

[75] Inventors: George Wong, San Francisco; Yan Rozenzon, Mountain View; Jeffrey Schmidt, Cupertino, all of Calif.

[73] Assignee: Applied Materials, Inc., Santa Clara, Calif.

[21] Appl. No.: 508,410

[22] Filed: Jul. 28, 1995

[51] Int. Cl.⁶ ................................. H01L 21/00
[52] U.S. Cl. ............... 156/626.1; 156/345; 156/643.1; 216/63; 216/66; 134/1.3
[58] Field of Search ................. 156/345, 626.1, 156/643.1, 657.1, 662.1; 134/1, 1.3; 216/63, 66; 148/DIG. 17; 437/228 ST

[56] References Cited

U.S. PATENT DOCUMENTS 5,300,187  4/1994  Lesk et al. ........................ 134/1.3
5,352,327  10/1994  Witowski ...................... 134/1.3 X Primary Examiner—William Powell
Attorney, Agent, or Firm—Peter J. Sgarbossa; Michael A. Glenn

[57] ABSTRACT

A programmable halogen lamp assembly radiantly heats a post-etch wafer in a semiconductor wafer processing environment to evolve corrosive, chlorine based compounds that reside on or in the processed wafer, preferably during wafer unloading to minimize throughput loss, and preferably under vacuum to prevent the onset of a corrosion reaction.

19 Claims, 4 Drawing Sheets

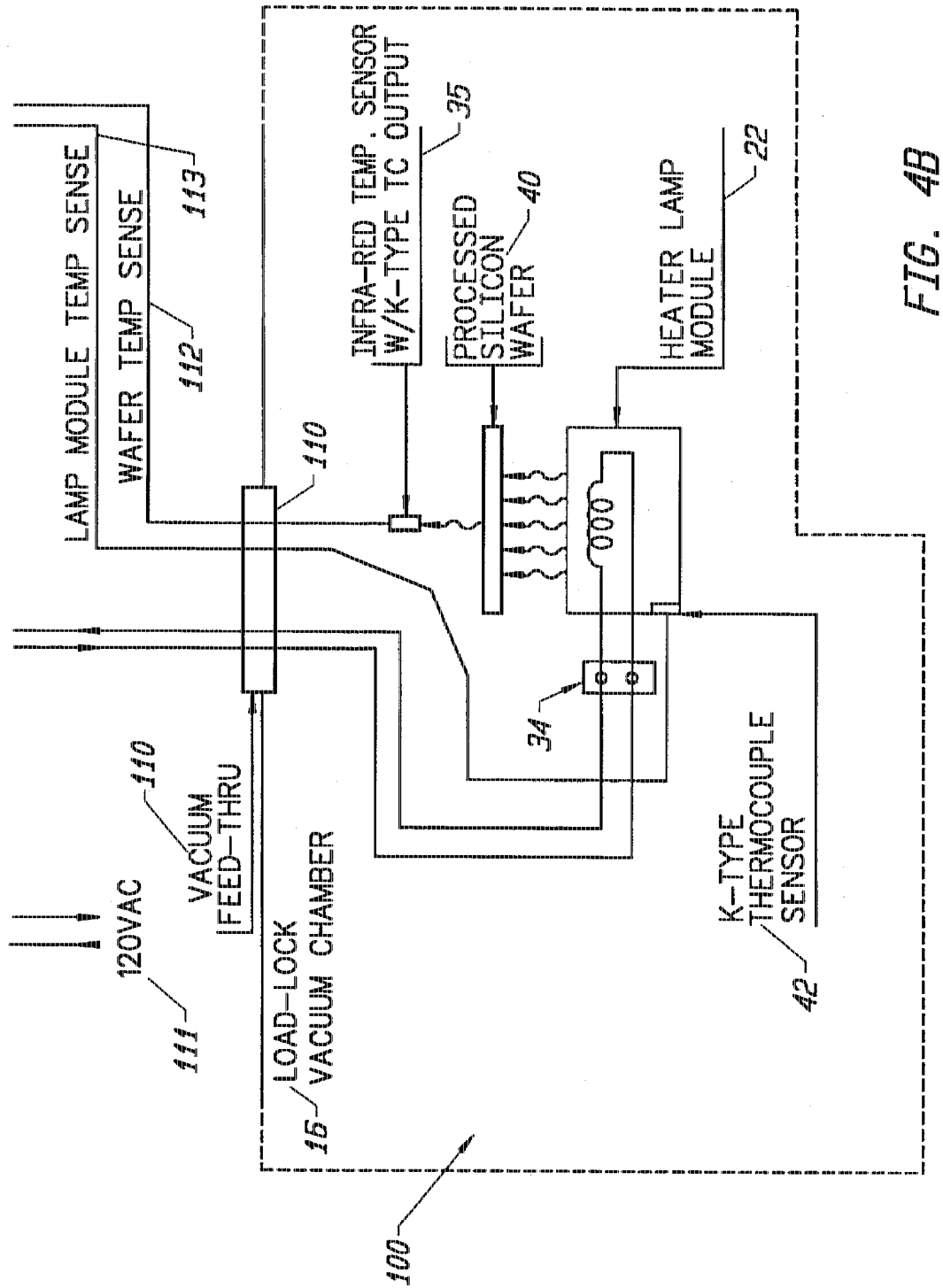

CHLORINE REDUCTION MODULE

BACKGROUND OF THE INVENTION

1. Technical Field

The invention relates to the fabrication of integrated circuits and other devices on semiconductor wafers. More particularly, the invention relates to the processing of semiconductor wafers with potentially corrosive materials.

2. Description of the Prior Art

Semiconductor processing employs highly volatile chemicals and chemical reactions to form device structures on the surface of a wafer. Among these reactions are certain reactions that are a byproduct of a desired processing step. For example, wafer etching, e.g. using a chlorine containing compound in the presence of a plasma, while useful to pattern the surface of a semiconductor wafer, may allow residual etchant materials, such as chlorine, to remain on the surface of the wafer. These materials are highly volatile. In the case of wafer etching with a chlorine containing compound, residual chlorine may combine with moisture to form hydrochloric acid. Thus, even though a wafer etching step is completed, the presence of residual chlorine provides conditions under which device structures on the surface of the wafer may be damaged, e.g. such as through corrosion due to the unwanted presence of hydrochloric acid.

While various cleaning or neutralizing steps may be used to prevent such corrosion, it has heretofore not been possible to otherwise eliminate residual materials, such as chlorine, without either exposing the wafer to neutralizing chemicals or otherwise removing the wafer from the process environment for post etch processing. Such further processing steps require additional wafer handling that increases total processing time, thereby impacting manufacturing throughput, and that allows the wafer to be exposed to multiple environments, thereby increasing the likelihood that the wafer surface may be contaminated.

It would be a significant improvement in the semiconductor wafer processing art to provide an effective, yet simple technique for obviating the deleterious affects of residual reactive materials on the wafer surface.

SUMMARY OF THE INVENTION

A programmable halogen lamp assembly is used in a semiconductor wafer processing environment to heat a post-etch wafer radiantly and thereby evolve corrosive, chlorine based compounds that reside on or in the processed wafer. Preferably, this procedure is performed during wafer unloading to minimize throughput loss, and preferably under vacuum to prevent the onset of a corrosion reaction, and to prevent exposure of the wafer to various environments, where the likelihood of contamination is increased.

DETAILED DESCRIPTION OF THE INVENTION

Figure 1:
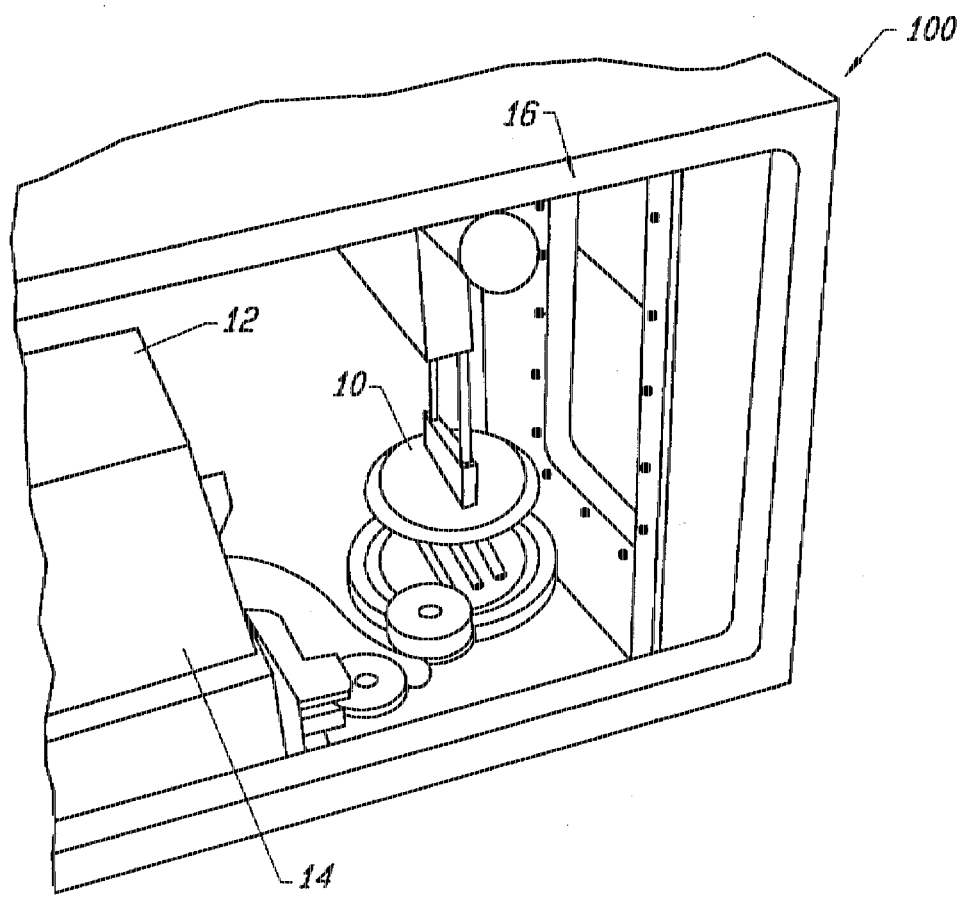
FIG. 1 is a perspective view of a chlorine elimination lamp module as situated in a process environment load chamber according to the invention.

FIG. 1 is a perspective view of a chlorine elimination lamp module as situated in a process environment load chamber according to the invention. The invention preferably finds application in a semiconductor wafer process environment, such as the batch etching system 100 shown in FIG. 1. In such system, the problem that exists in the industry today is that of post-etch corrosion, where the wafer is exposed to chlorine and/or chlorine-based chemistries during processing within a processing environment 16, such that when the doors of the batch etching system are opened and the processed wafers 12, 14 contained therein are exposed to the atmosphere, the wafers start to corrode. This problem is discussed in detail above.

Figure 2:
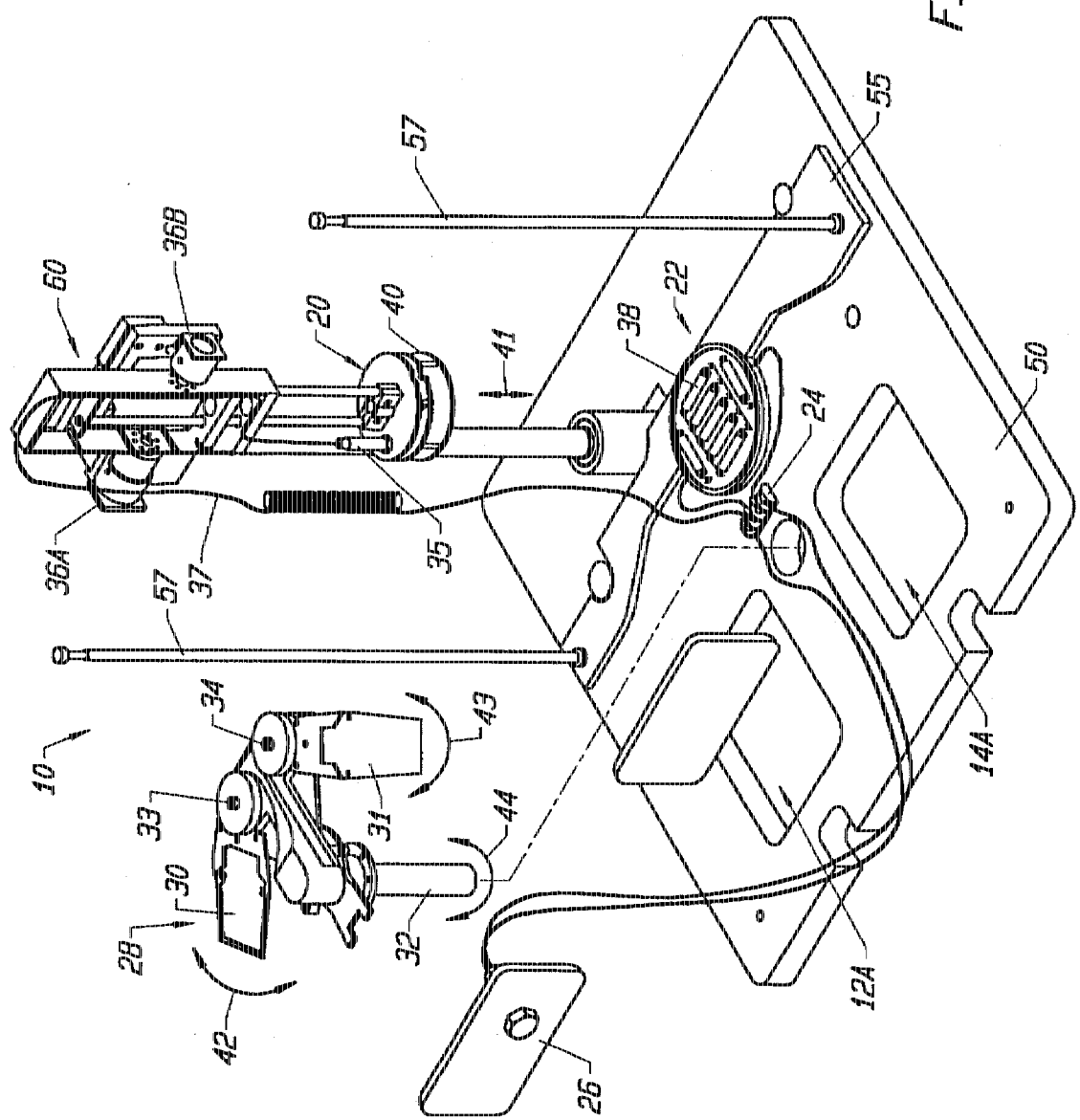
FIG. 2 is a perspective view of the chlorine elimination lamp module according to the invention.

The preferred embodiment of the invention provides a chlorine elimination lamp module (CELM) 22 that places an array of halogen lamps 38 underneath a wafer shuttle mechanism (see FIG. 2). The batch etching system is typically an existing mechanism to which the CELM is retrofitted, although the CELM is also readily incorporated into wafer processing equipment at the equipment design stage. The CELM may also be used in connection with other processing equipment, where such thermal treatment is useful.

FIG. 2 is a perspective view of the chlorine elimination lamp module 22 according to the invention. A wafer shuttle mechanism 10 includes a blade assembly 28 which, in the exemplary embodiment of the invention includes a pair of wafer blades 30, 31 that are rotatable about a respective pivot point 33, 34 as shown by the arrows identified by the respective numeric designators 42, 43. The blade assembly may also be rotated by an actuator 32 about a pivot axis, as shown by the arrow identified by the numeric designator 44.

The wafer shuttle mechanism also includes a wafer handler 60 that includes a wafer gripper assembly 20 which is movably fixed to a track for relative up and down motion, as indicated by the arrow identified by the numeric designator 41. The wafer gripper assembly typically includes fingers that open and close to lift the wafer 40 from the wafer blade. Stepper motor 36a serves to rotate the wafer handler 60, while stepper motor 36b provides the relative up and down movement shown by the arrow identified by the numeric designator 41. Each blade 30, 31 serves to insert and withdraw wafers from a respective stack of wafers 12, 14 (FIG. 1) which typically reside on a lift/indexing mechanism (not shown) within respective wells 12a, 14a formed within a transfer assembly base 50.

The process load chamber also may include a feed through, blank off plate 26. The plate serves two functions: (1) it allows feed through of the CELM electronics from the process environment, which is under vacuum, to the electronic control box, which is at atmospheric pressure; and (2) it shields a user's eyes from accidental exposure to light from the halogen heat lamps.

FIG. 2 also shows a plate 55, which is an integral feature of the lamp assembly 22. A pair of posts 57 having an adjustable height are included to secure the lamp assembly 22 and plate 55 to the base plate 50. This arrangement allows for conductive heat transfer from the lamp assembly to the base plate 50.

Operation of wafer transfer mechanisms is well known in the art and the mechanism, insofar as it is not specifically concerned with the invention herein, is therefore not discussed in detail. It will be appreciated by those skilled in the art that the invention herein is readily adapted for use with many types of wafer processing environments and that the invention is not limited to the exemplary processing environment described herein. Furthermore, it is not necessary that the invention be located for operation with a wafer transfer mechanism, but may be placed within a wafer processing path, for example in a load lock or other passage within a multi-chamber wafer processing environment.

In operation, as the wafers are unloaded, they are placed on the unload blade 30 and paused over the lamp module 22. The lamp module is then turned on for a preset time and temperature, such that the heat energy drives out residual chlorine that is deposited and present on the wafer. The unload blade is preferably a modified standard, solid unload blade, in which the inner portion of the blade is cut away to allow maximum exposure of a wafer carried on the blade to the heat lamps when the blade is paused over the heat lamps.

The chlorine elimination lamp module has two major components, one of which is the lamp module itself 22, which is a stack arrangement of different plates that hold an array of heat lamps 38, and that delivers power to the heat lamps from a terminal block 24. Although the terminal block is shown separately from the lamp module, the terminal block may be located on the lamp module itself. Additionally, while heat lamps, such as halogen lamps are preferred, the invention may be practiced with any electrically operated radiant heat source.

The second major component of the CELM is a power/control assembly 120 (FIG. 3), which sets the time that the lamps remain on and the target temperature that the wafer must reach and maintain, such that chlorine elimination is accomplished. The power/control assemby also coordinates operation of the CELM with that of the wafer transfer mechanism.

Figure 3:
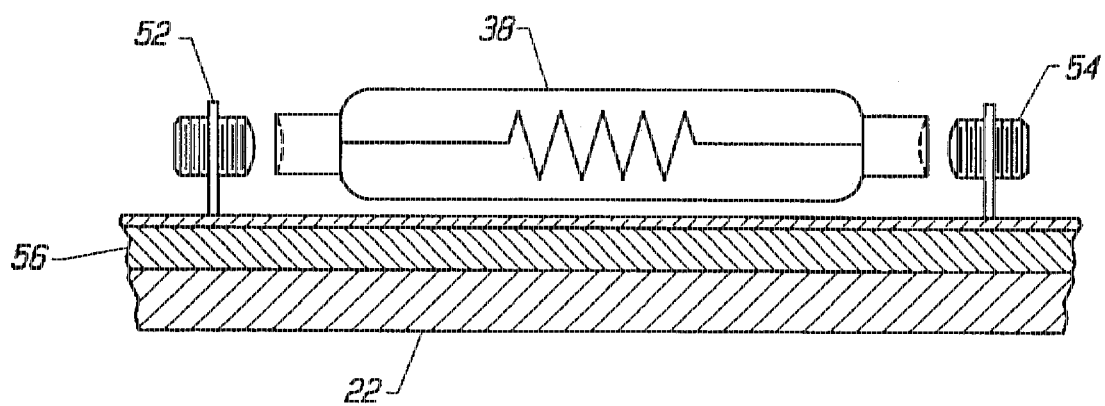
FIG. 3 is a detailed side view of a chlorine elimination lamp module showing a halogen lamp mounting.

FIG. 3 is a detailed side view of a chlorine elimination lamp module showing a halogen lamp mounting. As discussed above, the lamp module assembly is composed of a series of stacked plates. The housing itself is preferably made of a material such as aluminum, while the power strips 52 are preferably silver plated aluminum strips that are insulated, for example with Teflon plates 56. The lamps 38 are halogen lamps that are preferably rated at 200 watts, although it has been found that satisfactory performance is obtained with a wide range of lamp values, such as with the use of 250 watt bulbs. In the preferred embodiment of the invention there are seven lamps that provide a total of 1400 to 1750 watts of heat energy. The lamps are preferably operated with a 110 volts AC voltage source, although other voltages, as well as DC, may be used, depending upon the rating of the lamp.

The lamps are preferably held in place by spherical head copper set screws 54 that are threaded for complementary engagement with threads formed on the inner surface of an aperture in the power strips. In this way, the halogen lamps may be securely fastened in place and yet they are readily removed for replacement. Furthermore, the power strips may accept halogen lamps of various lengths, depending upon how much the set screws are threaded into the power strip aperture. Alternatively, the power strips may consist of other lamp contacting means, such as metal contacts, springs, and sockets.

The gripper assembly 20 includes an infrared thermocouple 35 that is positioned facing down onto the wafer 40 so that during processing the wafer temperature is monitored to determine when the wafer has reached the target temperature. A pair of conductors 37 connects the thermocouple to the vacuum feedthrough 110 from which the thermocouple is connected into the controller assembly 120 (FIG. 4) to provide a closed loop control device. Thus, the thermocouple controls the lamp module assembly much like a thermostat controls the heating/cooling system in a house.

The heat lamps are preferably programmed to heat each wafer for 30 seconds. This raises the temperature of the wafer to about 200° F. to 275° F. The actual temperature range is selected based upon the process chemistry that is used. The actual exposure time is chosen such that it is not so long that it impacts process throughput, and not so short that it does not complete the chlorine elimination process. It will be appreciated that time and temperature are related both to each other and to the elimination model that is implemented by the invention. Thus, lamps having higher heating capacity heat the wafer faster and thereby achieve the desired temperature more quickly. Furthermore, the invention may be used with corrosives other than chlorine, e.g. fluorine, such that the preferred wafer temperature and heating time is different.

It is preferred that the entire operation takes place under a vacuum. Thus, after the wafer is heated for the preset time and to a preset temperature, it is then unloaded. That is, after heat processing for chlorine elimination, each wafer is placed into a wafer cassette until an entire load of wafers is similarly processed. Then the processing environment is brought up to atmospheric pressure, and the wafers are subsequently removed.

Figure 4A:
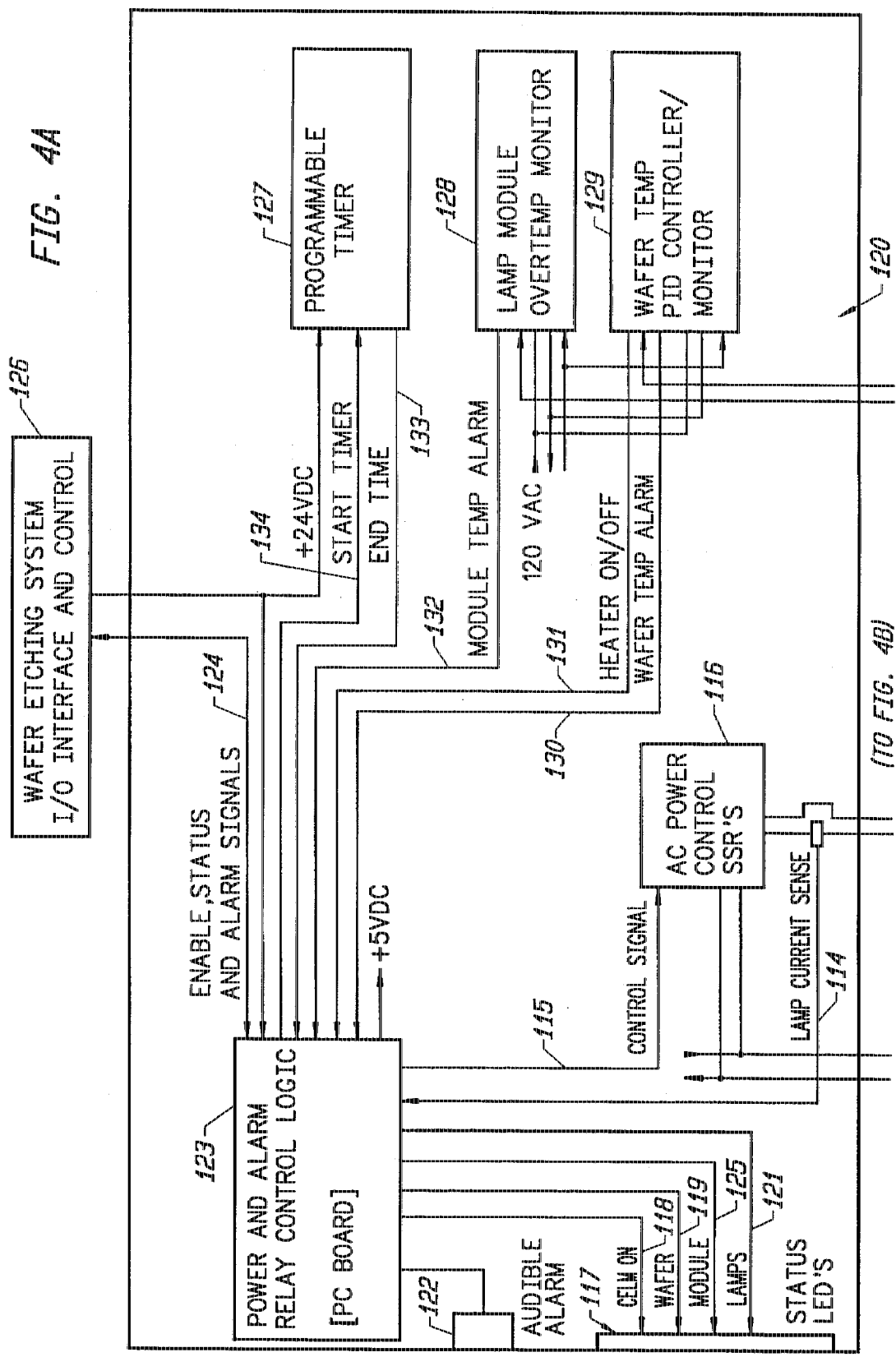
FIG. 4 is a block level schematic diagram of a control system for a chlorine elimination lamp module according to the invention.

FIG. 4 is a block level schematic diagram of a control system 120 for a chlorine elimination lamp module 22 according to the invention. The CELM is operated by microprocessor computer control. As shown in FIG. 4, within the process environment 100 a processed silicon wafer 40 is positioned between a heater lamp module 22 and an infrared temperature sensor having a K-type thermocouple output 35. A k-type thermocouple is a thermocouple that has a dissimilar metal-alloy junction which, in the preferred embodiment of the invention is an alumel-chromel junction. The heater lamp module also includes a K-type thermocouple sensor 42. The infrared sensor may be any type commercially available, such as an Exergen model IRt/c.2k - 240° F./120° C.

The CELM components within the process environment are connected to a 110 VAC source via the terminal strip 24, and leads therefore are routed from the process environment through a vacuum feedthrough 110 to the control assembly 120. The control assembly preferably operates from a voltage supply, such as a 110 volt AC source 111. The control assembly includes an AC power control sensor circuit 116 that operates in response to a control signal 115 supplied by a power and alarm relay control logic circuit 123. The power and alarm relay control logic circuit monitor operation of the control circuit and various sensors to provide both a status indication via status LED's 117 that may include a CELM on indicator 118, a wafer over temperature indicator 119, a module over temperature indicator 125, and a replace lamps indicator 121. An audible alarm 122 may also be provided. It will be appreciated that status and alarm conditions may be reported in many ways, including to a central control location via a data network for display on a computer terminal.

The power and alarm relay control logic circuit generates status and alarm signals based upon sensor input provided thereto. Thus, a lamp current sense signal 114, wafer temperature alarm signal 130, heat on/off signal 131, module temperature alarm signal 132, end time signal 133, and various enable, status, and alarm signals 124 are provided to the power and alarm relay control logic circuit. Furthermore, the power and alarm relay control logic circuit may be in communication with a wafer etching system I/O interface and control circuit 126 to monitor and coordinate various operations of the process environment with the operation of the CELM.

The control assembly 120 also includes a programmable timer 127 that receives a start time signal 134 and send an end time signal 133. In this way, the duration of the heating cycle is programmably set and maintained. Processing temperature is controlled to maintain the heating lamps within a desired operating temperature range, as indicated by a lamp module over temperature module 128, by a wafer temp proportional, integral, and derivative (PID) controller/monitor module 129, which monitors wafer temperature and controls lamp operation in response thereto to assure that a selected wafer temperature is obtained and maintained, but not exceeded.

Depending upon the process environment into which the invention is incorporated, it is anticipated that control signals should be provided for operation of the wafer transfer mechanism to provide a wafer heating station at which the CELM is located. The provision of such control signals is considered a matter of choice within the skill of those skilled in the art.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

We claim:

1. An apparatus for post processing a processed wafer, comprising:

a radiant heat source for heating said processed wafer in a semiconductor wafer processing environment to evolve corrosive compounds that reside on or in said processed wafer.

2. The apparatus of claim 1, said heat source further comprising:

a heat lamp assembly.

3. The apparatus of claim 2, said heat lamp assembly further comprising:

a halogen heat lamp assembly.

4. The apparatus of claim 1, further comprising:

means for programming said heat source.

5. The apparatus of claim 4, said means for programming further comprising:

a timer for maintaining heat source operation for a selected period of time.

6. The apparatus of claim 5, said means for programming further comprising:

a heat sensor for detecting heat source temperature and for maintaining a selected heat source temperature.

7. The apparatus of claim 4, said means for programming further comprising:

a heat sensor for detecting wafer temperature and for maintaining a selected wafer temperature.

8. The apparatus of claim 1, further comprising:

means for transferring said wafer between a position within proximity to said heat source for heating and a position for any of wafer loading, unloading, and processing.

9. The apparatus of claim 1, wherein said processing environment is maintained under a vacuum during wafer heating.

10. An apparatus for post processing a processed wafer, comprising:

a heat lamp assembly for radiantly heating said processed wafer under vacuum in a semiconductor wafer processing environment to evolve corrosive compounds that reside on or in said processed wafer;

means for programming said heat lamp assembly comprising a timer for maintaining heat source operation for a selected period of time; and a first heat sensor for detecting wafer temperature and for maintaining a selected wafer temperature during heat lamp assembly operation.

11. The apparatus of claim 10, said heat lamp assembly further comprising:

a halogen heat lamp assembly.

12. The apparatus of claim 10, further comprising:

a second heat sensor for detecting heat lamp temperature and for maintaining a selected heat lamp assembly temperature.

13. The apparatus of claim 10, further comprising:

means for transferring said wafer between a position within proximity to said heat source for heating and a position for any of wafer loading, unloading, and processing.

14. The apparatus of claim 10, wherein said heat lamp assembly further comprises:

an array of heat lamps.

15. The apparatus of claim 14, further comprising:

means for securely and removably mounting said heat lamps.

16. The apparatus of claim 15, said means for mounting further comprising:

an insulating base;

at least on contact terminal projecting from said insulating base, said contact terminal having a threaded aperture formed therethrough; and at least one set screw having a thread that is complementary to that of said contact terminal aperture, said set screw being positionable within said aperture with an end portion thereof in contact with at least one contact of a heat lamp to securely and removably mount said heat lamp to said heat lamp assembly.

17. A process for post processing a processed wafer, comprising the steps of:

radiantly heating said processed wafer under vacuum in a semiconductor wafer processing environment with a heat lamp assembly to evolve corrosive compounds that reside on or in said processed wafer;

maintaining heat source operation for a selected period of time;

detecting wafer temperature with a first heat sensor; and maintaining a selected wafer temperature during heat lamp assembly operation.

18. The method of claim 17, further comprising the steps of:

detecting heat lamp temperature with a second heat sensor; and maintaining a selected heat lamp assembly temperature.

19. The method of claim 17, further comprising the step of:

transferring said wafer between a position within proximity to said heat source for heating and a position for any of wafer loading, unloading, and processing.

* * * * *